United States Patent [19]

Laymoun

[11] Patent Number: 5,016,214
[45] Date of Patent: May 14, 1991

[54] MEMORY CELL WITH SEPARATE READ AND WRITE PATHS AND CLAMPING TRANSISTORS

[75] Inventor: Samir M. Laymoun, Sunnyvale, Calif.

[73] Assignee: Fairchild Semiconductor Corporation, Culpertino, Calif.

[21] Appl. No.: 3,114

[22] Filed: Jan. 14, 1987

[51] Int. Cl.$^5$ ............................................. G11C 11/411
[52] U.S. Cl. ..................... 365/154; 365/155; 365/189.06; 365/230.05; 365/226
[58] Field of Search ............... 365/155, 179, 154, 156, 365/190, 189, 129, 230, 189.04, 189.06, 230.05, 226

[56] References Cited

U.S. PATENT DOCUMENTS

| | | | |
|---|---|---|---|
| 3,671,946 | 6/1972 | Aagaard | 365/155 |
| 3,675,218 | 7/1972 | Sechler | 365/154 |
| 4,412,312 | 10/1983 | Berger et al. | 365/190 |
| 4,480,319 | 10/1984 | Hotta et al. | 365/155 |
| 4,635,231 | 1/1987 | Mori et al. | 365/155 |
| 4,701,883 | 10/1987 | Wrathall et al. | 365/156 |
| 4,745,580 | 5/1988 | Laymoun et al. | 365/155 |
| 4,754,430 | 6/1988 | Hobbs | 365/155 |
| 4,779,230 | 10/1988 | McLaughlin et al. | 365/190 |
| 4,833,651 | 5/1989 | Seltzer et al. | 365/230.05 |

FOREIGN PATENT DOCUMENTS

| | | | |
|---|---|---|---|
| 0144834 | 11/1979 | Japan | 365/154 |
| 0133585 | 8/1982 | Japan | 365/190 |

OTHER PUBLICATIONS

Cavaliere et al., "Memory Cell Adapted for Different Combinations of Simultaneous Read and Write Operations", IBM Tech. Disc. Bull., vol. 23, No. 1, Jun. 1980, pp. 180–186.

*Primary Examiner*—Glenn Gossage
*Attorney, Agent, or Firm*—Burns, Doane, Swecker & Mathis

[57] ABSTRACT

Two pairs of bit lines are associated with each column of memory cells in a static random access memory (RAM) to provide separate paths for reading and writing operations or to provide a RAM having dual read ports. One pair of bit lines is connected to the emitters of the cross-coupled transistors in each cell to permit write operations to be carried out. The second pair of bit lines is connected to the collectors of clamping transistors which limit the collector voltage of the cell transistors, to permit data to be read.

9 Claims, 2 Drawing Sheets

MEMORY CELL WITH SEPARATE READ AND WRITE PATHS AND CLAMPING TRANSISTORS

BACKGROUND OF THE INVENTION

The present invention is directed to random access memory circuits, and more specifically to static random access memory circuits. In a particular preferred embodiment, the present invention provides an improved variable clamp memory circuit of the type disclosed in commonly assigned, copending application Ser. No. 872,292 filed June 9, 1986, now U.S. Pat. No. 4,745,580.

A conventional static random access memory is comprised of an array of memory cells, each of which includes a cross-coupled pair of transistors that form a bistable latch circuit which stores one bit of binary data. In accordance with the particular bit of data that is stored in a cell, one of the cross-coupled transistors is on, i.e. in a conductive state, and the other transistor is off. The voltage present at the collector of the transistor which is off is at a high level relative to that at the collector of the transistor which is on. The difference between the voltages at the two collectors is often referred to as the cell voltage swing, and its polarity is detected to determine the bit of data stored in the cell. Typically, this detection is carried out by means of a pair of bit lines that are respectively connected to the emitters of the transistors in the cross-coupled pair.

The writing of a bit of data into a cell is accomplished by driving the appropriate one of the two transistors into its conductive state. Basically, this procedure involves pulling the voltage on the bit line connected to the appropriate transistor to a level which is sufficiently low to cause that transistor to conduct. If desired, the voltage on the other bit line can be raised at the same time to reduce the base-emitter voltage of the other transistor in the cell, thereby rendering it less conductive.

In an effort to decrease the time required to write a bit of data into a cell, and hence increase the operating speed of the memory, it is desirable to avoid saturation and minority carrier storage in the cross-coupled transistors. To this end, it is a general design objective to make the voltage swing of the cell as small as possible. In addition to avoiding saturation, a small cell swing reduces the voltage excursion which must take place each time the stored bit is changed from one binary value to its complement.

However, the objective of having a small voltage swing for a cell poses significant limitations in the overall design of the memory circuit, particularly with regard to noise immunity. Specifically, the determination of the relative polarity of the bit lines, i.e. the reading of data, is carried out with reference to a read threshold voltage. This threshold voltage must be at a value between the high and low voltage levels of the cell's collector nodes, and is preferably near the midpoint of these two levels. It will be appreciated that, as the cell swing is made smaller, the design specifications for the read voltage become more stringent. In particular, they require a precise determination of the high and low voltages, and their range of variation must also be known. Once the proper read threshold voltage is determined, it must be maintained within strict limits. If noise in the read threshold voltage or in the word line voltage should be sufficient to bring the read level above the cell high voltage or below its low voltage, data could be lost or read incorrectly.

BRIEF STATEMENT OF THE INVENTION

Accordingly, it is desirable to avoid the limitations which a small cell swing poses on the read threshold voltage. In accordance with the present invention, this objective is accomplished by providing separate paths for data that is written into a cell and data that is read from a cell. The writing of data is carried out by means of the conventional bit lines that are connected to the emitters of the cross-coupled transistors. Rather than read data through these bit lines, however, a second pair of bit lines are provided for each cell. These auxiliary bit lines are connected to the collectors of clamping transistors which control the voltages at the collectors of the cross-coupled transistors.

By performing the reading and writing operations by means of separate pairs of bit lines, the circuits associated with the writing operation are freed from the constraints associated with the read threshold voltage. In other words, the write control voltages for pulling the appropriate bit line low are not required to return to a well defined read threshold after each operation. Further, the read operation on the additional bit lines merely involves detection of the presence of current, and does not require a threshold voltage against which cell voltages must be compared.

As an alternative, both reading and writing can be carried out by means of the first pair of bit lines in the conventional fashion. In this case, the second pair of bit lines forms a supplemental read path, thereby providing a dual port random access memory cell.

Further features of the invention and the advantages provided thereby are explained in greater detail with reference to preferred embodiments of the invention illustrated in the accompanying drawings.

DESCRIPTION OF THE ILLUSTRATED EMBODIMENTS

To facilitate an understanding of the features of the invention and the advantages provided thereby, particular embodiments are described with reference to their implementation in a memory circuit employing emitter-coupled npn transistor logic. It will be appreciated by those having familiarity with this art, however, that the practical applications of the invention are not limited to these specific embodiments.

Figure 1:
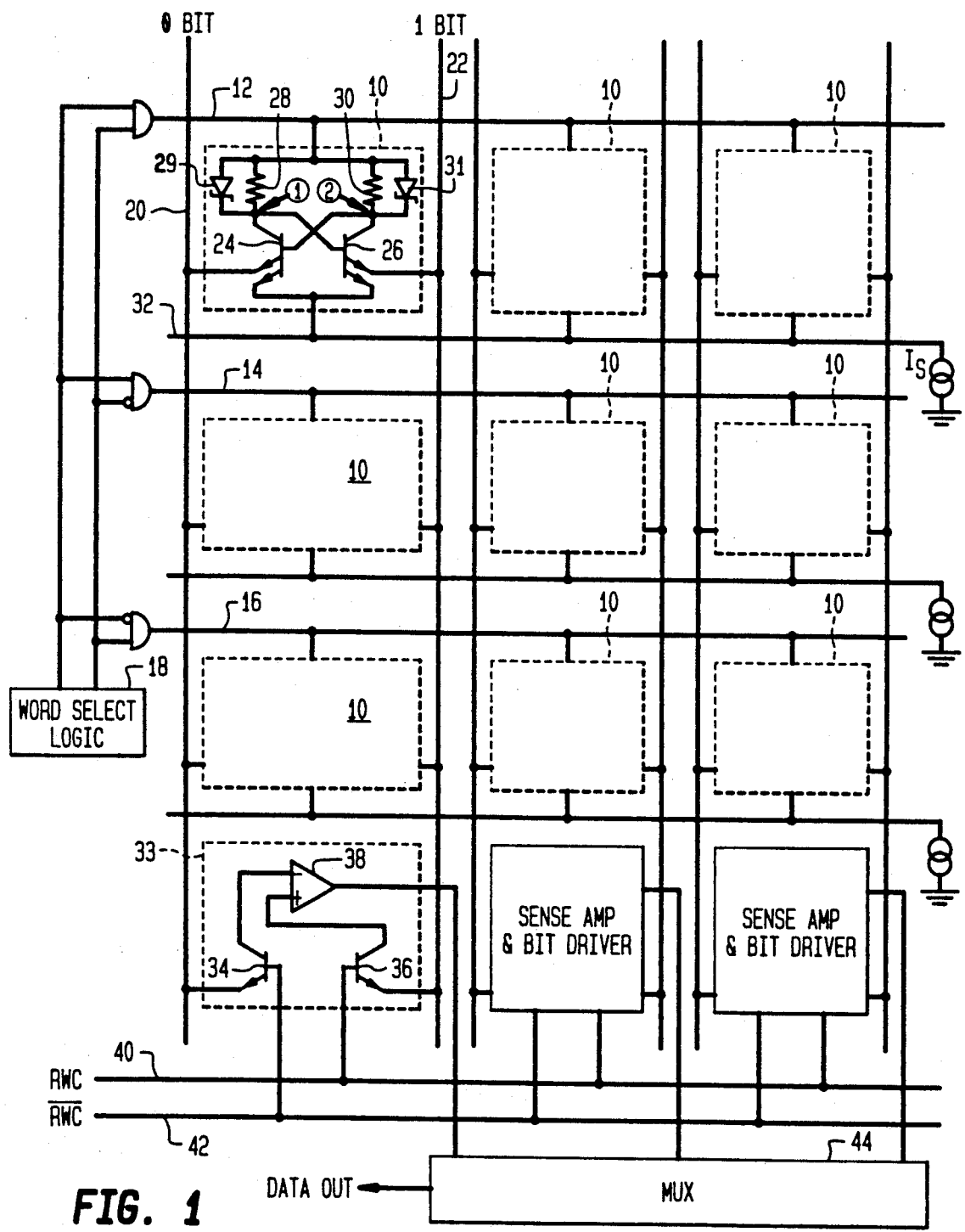
FIG. 1 is a partial block and partial schematic circuit diagram of a conventional memory circuit.

To further clarify the objectives that are achieved by the present invention, reference will first be made to a conventional static random access memory circuit. Referring to FIG. 1, a memory circuit that is embedded in an integrated circuit chip comprises an array of memory cells 10 arranged in rows and columns. All of the memory cells in a row are connected to a common word line 12, 14, 16. The voltage on the individual word lines are selectively controlled by means of a word select logic circuit 18. All of the memory cells in a column of the array are connected to a pair of complementary bit lines 20 and 22. One bit line 20 is associated with one level of binary data, e.g. logic zero, and the other bit line 22 is associated with the complementary data level, e.g. logic one.

Each memory cell 10 basically comprises a bistable latch circuit having a structure such as that shown in the upper left-hand cell in the circuit of FIG. 1. This latch circuit includes a pair of cross-coupled bipolar transistors 24 and 26. The base of one transistor 24 is connected to the collector of the other transistor 26, and vice versa. The collectors of the transistors are also connected to the word line 12 by means of respective load resistors 28 and 30. In the embodiment shown in FIG. 1, the transistors 24 and 26 have dual emitters. One emitter of each transistor is connected to a respective one of the bit lines 20 or 22. Another emitter of each transistor is coupled to an emitter of the other transistor, and the coupled emitters are connected to a common line 32, sometimes referred to as a lower word line. In the embodiment shown in FIG. 1, this lower word line is connected to a current source $I_s$.

In operation, when it is desired to read the data stored in a row of memory cells, the voltage of the word line 12 associated with that row is raised by means of the word select logic 18. The voltages of the other word lines are maintained at a lower standby level. When the word line voltage of a selected cell is raised, one of the transistors in the cell conducts current. For example, if a zero bit is stored in the cell the transistor 24 conducts and the transistor 26 is non-conductive. As a result, collector current flows through the load resistor 28, and a much smaller base current flows through the resistor 30. Thus, the voltage at the collector of the transistor 26, labelled node 2 in FIG. 1, is higher than the voltage at the collector of the transistor 24, node 1. Both of these voltages are referenced to the voltage on the word line 12.

To increase the speed of operation of the circuit it is desirable to avoid saturation of the transistors 24 and 26. This objective is accomplished by providing Schottky diode clamps 29 and 31 in shunt with the load resistors 28 and 30. These clamps limit the collector voltages of the transistors, and thereby prevent saturation.

The determination of the particular bit of data that is stored in the addressed cell is carried out by a bit driver and sense amplifier 33 connected to the bit lines 20 and 22. The bit driver and sense amplifier includes a pair of bit line driver transistors 34 and 36 whose emitters are connected to the respective bit lines 20 and 22 and whose collectors are connected to the input terminals of a differential amplifier 38. The bases of the bit line driver transistors 34 and 36 are connected to a pair of complementary read/write control lines 40 and 42.

To read the data, the signals RWC and $\overline{RWC}$ on the control lines 40 and 42 are set at a level intermediate the high voltage on node 2 of the cell and the low voltage on node 1 of the cell. In this state, current in the zero bit line 20 is absorbed by the conducting transistor 24, and current in the one bit line 22 is absorbed by the transistor 36 in the sense amplifier 33. The differential voltage generated by the difference in the collector currents of the two transistors 34 and 36 is detected by the differential amplifier 38, which produces an output signal that is fed as a bit of data to a multiplexer 44.

To write a bit of data into the cell, the control signal on one of the lines 40 or 42 is lowered to cause the voltage on the associated bit line to be pulled low. When this occurs, the base-emitter voltage of the transistor 24 or 26 connected to that bit line will increase, causing that transistor to conduct. If desired, the control signal on the other line 40 or 42 can be raised, to increase the voltage on the other bit line, thereby rendering the cell transistor connected to that bit line to be less conductive and facilitating a change in the state of the latch.

As noted previously, it is desirable to make the voltage difference between the nodes 1 and 2 small, and thereby increase the switching speed, i.e. decrease the write time, of the circuit. However, by doing so stringent limitations are imposed on the read level of the control signals RWC and $\overline{RWC}$. If noise should cause this read level to fluctuate too close to the high voltage or the low voltage at the cell nodes, the reading speed could be adversely affected, or data could be misread and possibly lost through an inadvertent write operation. In accordance with the present invention, this limitation is overcome by separating the read and write functions on different sets of bit lines.

Figure 2:
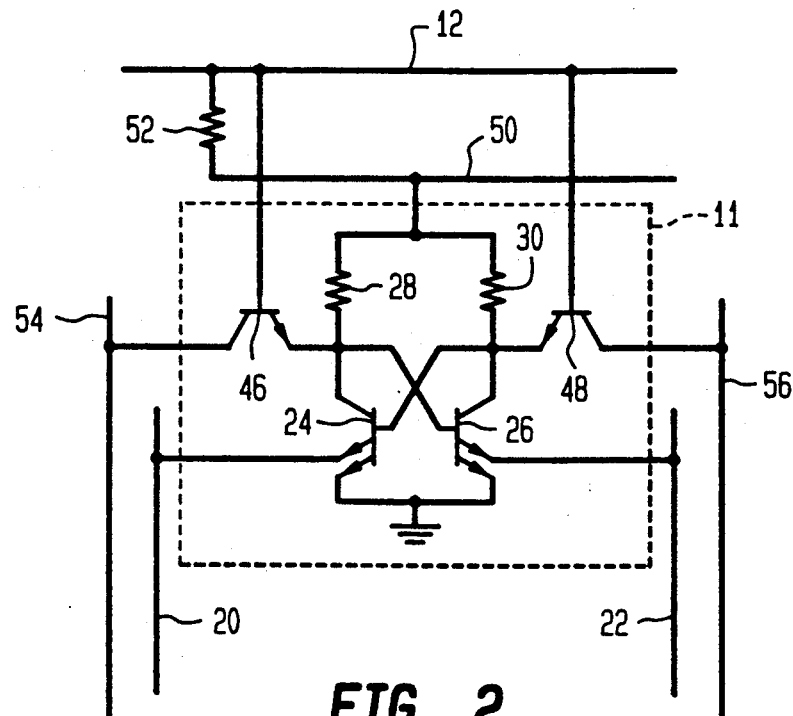
FIG. 2 is a schematic circuit diagram of a memory cell embodying the present invention.

A memory cell circuit which incorporates this principle of the present invention is shown in FIG. 2. Like the conventional memory cell, it includes the emitter-coupled, cross-coupled transistors 24 and 26 and the load resistors 28 and 30. Emitters of the cross-coupled transistors are connected to bit lines 20 and 22. In place of the Schottky diode clamps, npn transistor clamps 46 and 48 have their emitters connected to the collectors of the cell transistors 24 and 26, and their bases connected to the word line 12. Instead of being connected to the word line 12, the load resistors 28 and 30 are connected to an auxiliary word line 50. This auxiliary word line is connected to the word line 12 by means of a resistor 52. As disclosed in copending application Ser. No. 872,292 filed June 9, 1986, now U.S. Pat. No. 4,745,580 the disclosure of which is herein incorporated by reference, the transistors 46 and 48 provide variable clamp voltages that limit the collector voltages of the transistors 24 and 26, and thereby prevent saturation.

Alternatively, the load resistors 28 and 30 can be directly connected to the word line 12 along with the bases of the transistors 46 and 48, thereby eliminating the auxiliary word line 50 and resistor 52.

In the circuits disclosed in the above-identified application, the collectors of the clamping transistors 46 and 48 are connected to a fixed potential, e.g. VCC. In accordance with the present invention, however, the collectors are used to provide read paths for the cell. More particularly, the collectors of the transistors 46 and 48 are connected to a second pair of bit lines 54 and 56.

By virtue of the read paths provided by the transistors 46 and 48, the reading and writing functions can be separated on different bit lines. More particularly, reading is accomplished with the bit lines 54 and 56 by sensing the collector currents of the transistors 46 and 48. For example, if the transistor 24 in the cell is on to store a binary zero, when the cell is addressed by raising the voltage on its word line 12, the collector current of transistor 24 flows through the clamping transistor 46 and the load resistor 28. The small base current of the transistor 24 flows primarily through the load resistor 30. Thus, a higher current will flow through the bit line 54 than through the bit line 56, and this difference can be detected by means of a sense amplifier connected to the bit lines 54 and 56.

On the other hand, the writing operation can be carried out in the normal fashion by means of the bit lines 20 and 22. Since these bit lines are not required to perform a read function, the circuits connected to these bit lines need not be designed to provide a strict read threshold level. Thus, the possibility of data error is made small even when the voltage swing of the cell is reduced.

Figure 3:
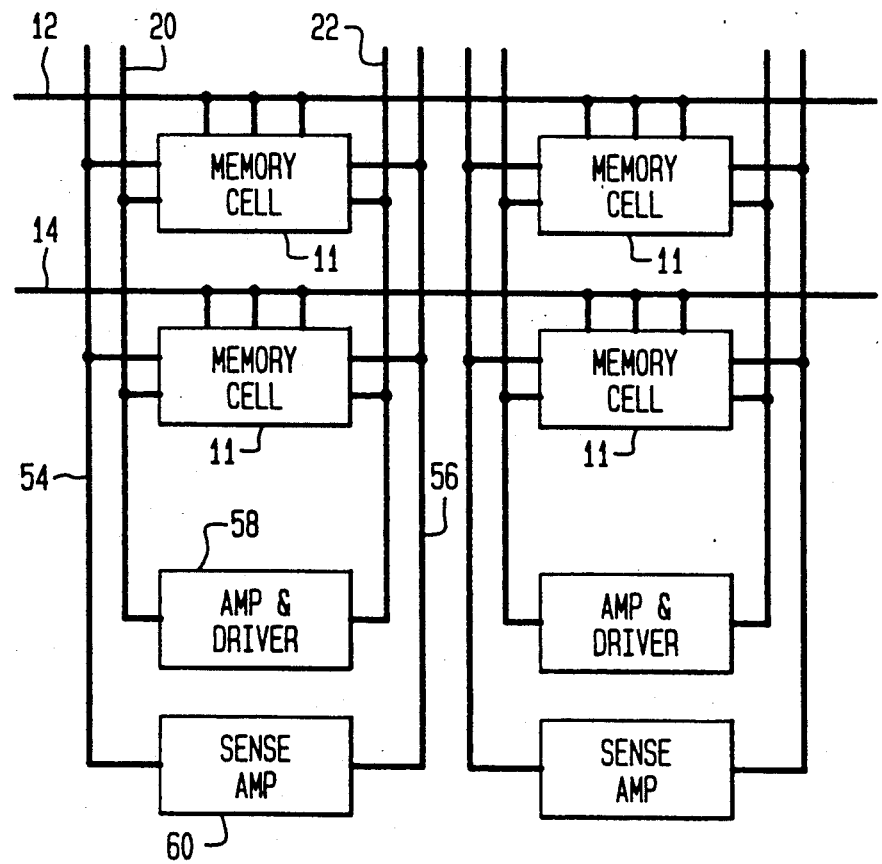
FIG. 3 is a block circuit diagram of a further embodiment of the present invention.

As an alternative, it may be desirable to use the bit lines 20 and 22 for both the read and write functions. In this case, the bit lines 54 and 56 function as a second read path. Referring to FIG. 3, a first sense amplifier and bit driver circuit 58 can be used to read and write data on the first pair of bit lines 20 and 22, and a second sense amplifier 60 can be used to read the data by means of the second pair of bit lines 54 and 56. Thus, a dual port RAM having clamped collector voltages to facilitate high speed operation is provided.

From the foregoing it can be seen that the present invention provides an alternative or supplementary read path for data stored in a memory cell having clamped collector voltages, to provide separate read and write paths or to provide a dual port RAM. These features are attained by utilizing the existing components within a cell, thereby avoiding the need for additional devices. Thus additional functionality is provided without increasing the size of a cell.

It will appreciated by those of ordinary skill in the art that the principles which underly the present invention can be incorporated in structures other than those specifically described herein. Accordingly, the disclosed embodiments are intended to be illustrative and not restrictive. The scope of the present invention is indicated by the following claims rather than the foregoing description, and all changes which come within the meaning and range of equivalents of the claims are intended to be embraced therein.

What is claimed is:

1. A random access memory circuit of the type having a plurality of memory cells and a main word line for providing a variable voltage which selectively enables data to be written into and read from the cells, each memory cell comprising:
   a pair of cross-coupled bipolar transistors wherein the base of a first transistor of said pair is connected to the collector of the second transistor of said pair and the collector of said first transistor is connected to the base of said second transistor;
   a pair of load resistors respectively connecting the collectors of said pair of cross-coupled transistors to a bias voltage;
   a pair of clamping transistors responsive to the voltage on said word line for respective controlling voltage levels at the collectors of said pair of cross-coupled transistors, said clamping transistors respectively connecting the collectors of said pair of cross-coupled transistors to a first pair of bit lines which conduct currents that are sensed to determine the value of data stored in the cell; and
   means for connecting emitters of said pair of cross-coupled transistors to a second pair of bit lines.

2. The memory circuit of claim 1 wherein each of said clamping transistors has a base connected to said word line, an emitter connected to the collector of an associated one of said pair of cross-coupled transistors, and a collector connected to a respective one of the bit lines in said first pair of bit lines.

3. The memory circuit of claim 1 wherein said bias voltage is the voltage on said word line.

4. The memory circuit of claim 1 further including an auxiliary word line providing a voltage related to the voltage on said main word line, and wherein said clamping transistors in each memory cell have base electrodes connected to said main word line, and said load resistors are connected to said auxiliary word line.

5. The memory circuit of claim 1 comprising plural word lines, and wherein said load resistors of each cell are connected to one of said plural word lines and the base electrodes of said pair of clamping transistors of each cell are connected to a different one of said plural word lines, said plural word lines providing respective voltages which are related to one another.

6. A memory circuit, comprising:
   a plurality of memory cells arranged in rows and columns, each memory cell including a pair of cross-coupled bipolar transistors for storing a bit of data and a pair of clamping transistors for respectively controlling the voltage levels at the collectors of said pair of cross-coupled transistors;
   at least one word line for each row of memory cells, said one word line for a row being connected to the bases of the clamping transistors in memory cells for that row to control the associated collector voltage levels;
   means for controlling voltage levels on said word lines to selectively address memory cells in a row of said memory circuit;
   a first pair of bit lines associated with each column of memory cells in said memory circuit, each of said bit lines in said first pair being connected to an emitter of one of the transistors of the pair of cross-coupled transistors in each of the memory cells of an associated column;
   means connected to said bit lines of said first pair for controlling voltage levels on said bit lines to write data into said memory cells;
   a second pair of bit lines associated with each column of memory cells, each of said bit lines of said second pair being connected to said cross-coupled transistors by means of the collector-emitter path of one of the clamping transistors in the memory cells of an associated column; and
   means for sensing the current in said bit lines of said pair to thereby read data stored in said memory cells.

7. The memory circuit of claim 6 wherein each of said clamping transistors has an emitter connected to the collector of a respective one of said pair of cross-coupled transistors, and a collector connected to a corresponding bit line of said second pair.

8. The memory circuit of claim 6 further including means connected to said first pair of bit lines for reading data stored in said cells via said first pair of bit lines.

9. The memory circuit of claim 8 wherein said sensing means includes a sense amplifier connected to said second pair of bit lines, and said means connected to said first pair of bit lines for reading data comprises a sense amplifier and a bit driver connected to said first pair of bit lines.

* * * * *